United States Patent [19]

Marschall

[11] Patent Number: 5,274,668

[45] Date of Patent: Dec. 28, 1993

[54] INTEGRATED CIRCUIT DEMODULATOR COMPONENT

[75] Inventor: Klaus W. Marschall, Meersburg, Fed. Rep. of Germany

[73] Assignee: Bodenseewerk Gerätetechnik GmbH, Uberlingen, Fed. Rep. of Germany

[21] Appl. No.: 774,319

[22] Filed: Oct. 10, 1991

[30] Foreign Application Priority Data

Apr. 4, 1990 [DE] Fed. Rep. of Germany ....... 4010798

[51] Int. Cl.$^5$ .......................... H04B 3/46; H04B 17/00
[52] U.S. Cl. ........................ 375/10; 375/3.1; 370/15; 371/20.5
[58] Field of Search ........................ 375/3, 3.1, 7, 8, 9, 375/10; 370/13, 13.1, 15, 16; 371/20.5, 24

[56] References Cited

U.S. PATENT DOCUMENTS

| | | | |
|---|---|---|---|
| 4,688,209 | 8/1987 | Banzi, Jr. et al. | 370/15 |
| 4,785,464 | 11/1988 | Judeinstein et al. | 375/3 |
| 4,866,775 | 9/1989 | Katakura | 381/3 |
| 4,918,623 | 4/1990 | Lockett et al. | 375/10 X |
| 5,010,544 | 4/1991 | Chang et al. | 370/13.1 |

Primary Examiner—Curtis Kuntz
Assistant Examiner—Bryan Webster
Attorney, Agent, or Firm—James Creighton Wray

[57] ABSTRACT

An integrated circuit demodulator component contains a demodulator circuit (90), a first input (12) and an output (30) connected to the demodulator circuit (90). Furthermore the demodulator component (10) has a second input (18) and a multiplexer (80), which is controlled by a selector signal at a selector input (110). The multiplexer optionally connects the first input (12) or the second input (18) to the demodulator circuit (90). This permits a test of the integrated circuit demodulator component (10) during operation with operational signals. To this end, a signal from a modulator component (148) is applied to the second input (18) through a test feedback loop (210). A processor (142) compares the output signal of the integrated circuit demodulator component (10) at a receiver (174) with a signal transmitted by a transmitter (178). In the case of non-identity, either the modulator component (148) or the demodulator component (10) is defective.

3 Claims, 2 Drawing Sheets

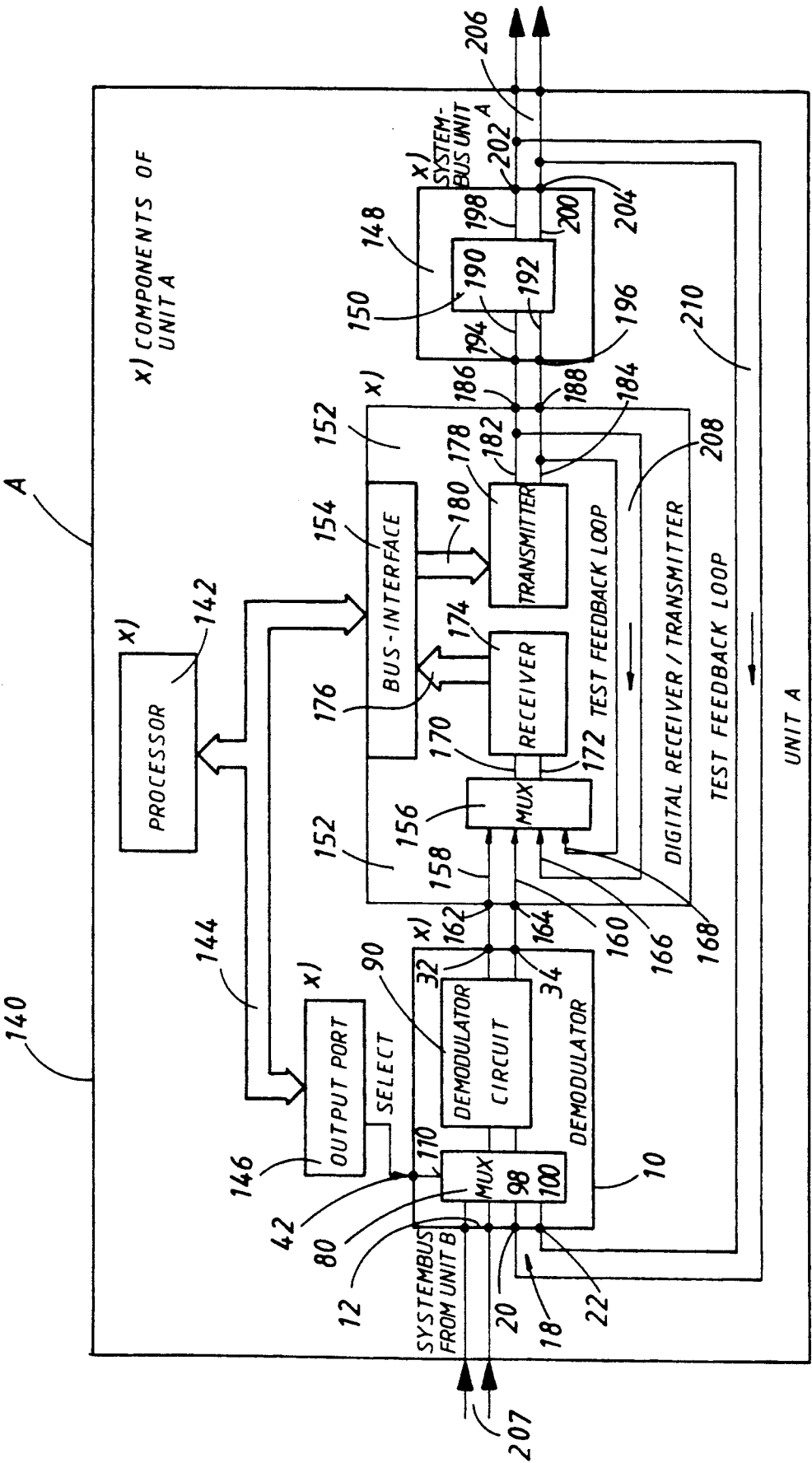

000
INTEGRATED CIRCUIT DEMODULATOR COMPONENT

BACKGROUND OF THE INVENTION

The invention relates to a integrated circuit demodulator component.

Furthermore the invention relates to a signal processing circuit making use of such integrated circuit demodulator component.

Such an integrated circuit demodulator component receives serial, digital words e.g. in accordance with the ARINC 429 aviation standard and serves to convert a bidirectional "return-to-zero" signal with two voltage levels, as specified in the ARINC 429 aviation standard, into two mutually inverted TTL-compatible "non-return-to-zero" output signals. These signals can then be processed further in a purely digital receiver logic.

Components of this type for demodulating ARINC 429 signals are well known.

In the specifications for the design of aircraft instruments, it is demanded that the components can be tested in operation (built-in-test) down to the level of the components (ABD 0048 of Airbus Industries). Such a test is not possible with conventional demodulator components.

SUMMARY OF THE INVENTION

It is an object of the invention to design an integrated circuit demodulator component of the type defined in the beginning such that testing during operation is possible.

It is a further object of the invention to design and connect an integrated circuit demodulator component of the type defined in the beginning such that it permits also the testing of other components belonging to the system.

According to the invention this object is achieved by an integrated circuit demodulator component comprising a demodulator circuit, a first input and a second input, a multiplexer arranged to optionally connect either said first input or said second input to said demodulator circuit, a selector input, arranged to receive a selector signal, said multiplexer being connected to said selector input to be controlled by said selector signal, and an output connected to said demodulator circuit.

With such an integrated circuit demodulator component, an operative signal from a modulator of the same system can optionally be applied to the second input through a test feedback loop. A processor checks, whether this signal from the integrated circuit demodulator component is converted into the correct output signal or data word, respectively. If this is not the case, either the modulator or the integrated circuit demodulator component is defective.

Discrimination between these two cases is possible by means of an integrated circuit demodulator component comprising (a) a first demodulator circuit and a second demodulator circuit,
(b) a first multiplexer associated with said first demodulator circuit and a second multiplexer associated with said second demodulator circuit,
(c) a first input of said integrated circuit demodulator component being arranged to be connected to said first demodulator circuit through said first multiplexer,
(d) a second input of said integrated circuit demodulator component being arranged to be connected to said first demodulator circuit through said first multiplexer,
(e) a third input of said integrated circuit demodulator component,
(f) said second input being arranged to be optionally connected to said second demodulator circuit through said second multiplexer,
(g) said third input being arranged to be optionally connected to said second demodulator circuit through said second multiplexer,
(h) a first output of said integrated circuit demodulator component, said first output being connected to said first demodulator circuit, and a second output of said integrated circuit demodulator component, said second output being connected to said second demodulator circuit, and
(i) a first selector input arranged to control said first multiplexer and a second selector input arranged to control said second multiplexer.

Preferably the integrated circuit demodulator component further comprises means for appying, for test purposes, during operation, signals to said second input for processing by said integrated circuit demodulator component.

Furthermore, the invention provides a signal processing arrangement comprising:

a processor arranged to transmit signals, through a data bus and a transmitter-receiver component, to a modulator component for further transmission to a system bus of a first unit, and to receive signals from the system bus of a second unit through an integrated circuit demodulator component of the type described hereinbefore, said transmitter-receiver component and said data bus, wherein, an output of said modulator component is connected to said second input of said integrated circuit demodulator component through a test feedback loop.

An embodiment of the invention is described hereinbelow with reference to the accompanying drawings.

BRIEF DESCRIPTION OF THE DRAWINGS

FIG. 2 is a block diagram of a signal processing arrangement with an integrated circuit demodulator component, the integrated circuit demodulator component being arranged to be tested during operation.

DETAILED DESCRIPTION OF THE DRAWINGS

Figure 1:
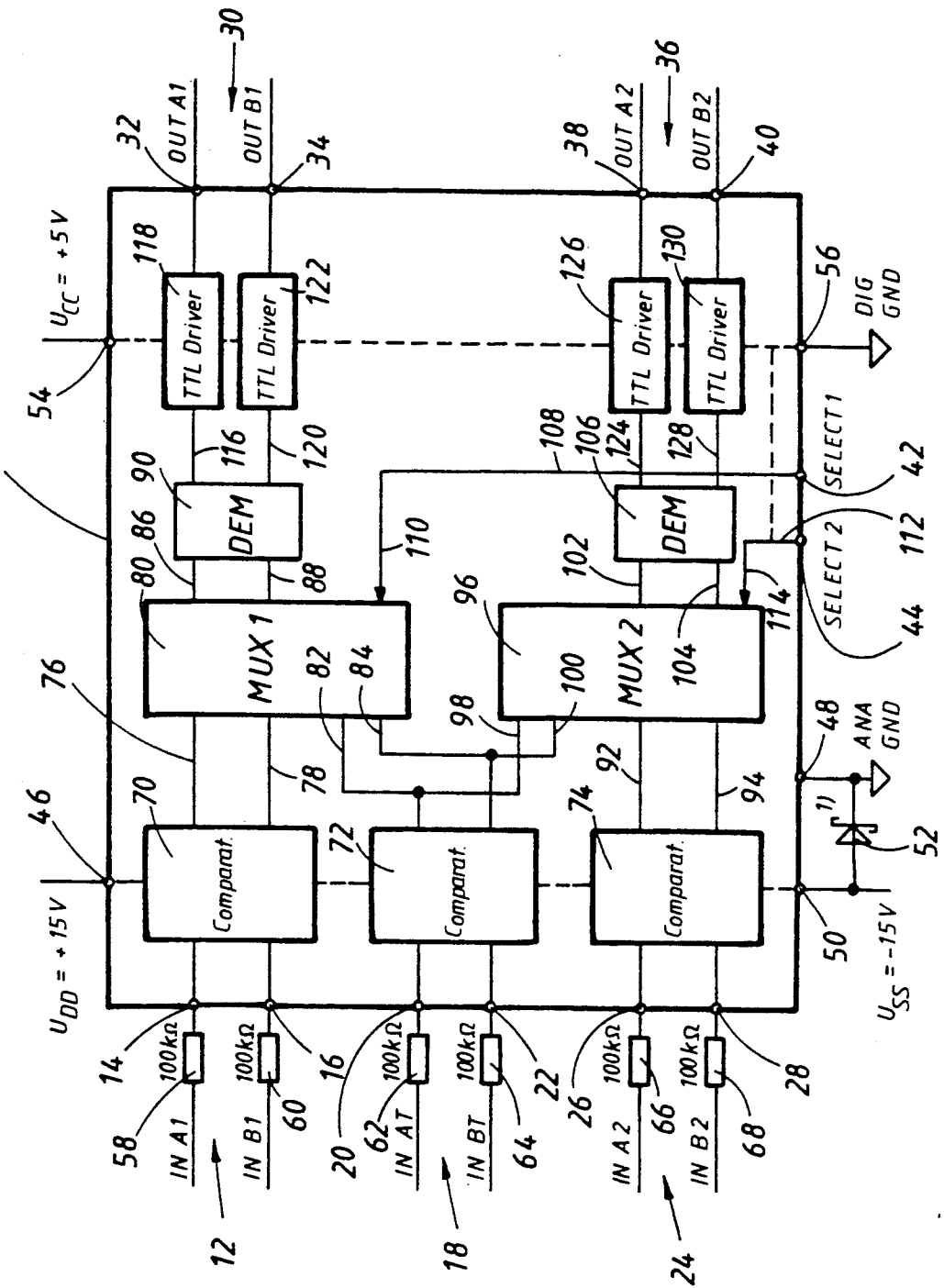
FIG. 1 is a block diagram of an integrated circuit demodulator component, which permits testing during operation.

Referring to FIG. 1, numeral 10 designates an integrated circuit demodulator component. The integrated circuit demodulator component 10 has a first input 12 with terminals 14 and 16. Furthermore, the integrated circuit demodulator component 10 has a second input 18 with terminals 20 and 22. Eventually, the integrated circuit demodulator component 10 has a third input 24 with terminals 26 and 28. The integrated circuit demodulator component 10 has a first output 30 with a first terminal 32 and a second terminal 34. The signal appearing at the second terminal 34 is inverse to the signal appearing at the first terminal 32. The integrated circuit demodulator component 10 has a second output with a first terminal 38 and a second terminal 10. The signal appearing at the second terminal 40 is inverse to the signal appearing at the first terminal. Furthermore, the integrated circuit demodulator component 10 has a first selection input 42 with a terminal and a second selection input 44 with a terminal. A supply voltage of +15 volts is supplied to a terminal 46. A terminal 48 is connected to "analog" ground. A supply voltage of −15 volts is supplied to a terminal 50. The voltage input of −15 volts is protected against voltage failure by means of a Schottky diode 52 connected to ground. A voltage of +5 volts is supplied to a terminal 54. A terminal 56 is connected to the "digital" ground.

Bidirectional "return-to-zero" signals having the voltage levels of +12.5 volts and −12.5 volts, as specified in the ARINC aviation standard mentioned above, are applied to the terminals of the inputs 12, 18, and 24 through resistors 58, 60; 62, 64; 66, 68, respectively. Two mutually inverted, TTL-compatible "non-return-to-zero" output signals appear at the terminals of the outputs 30 and 36. These output signals are processed further in a purely digital receiver logic.

The terminals 14 and 16 of the first input 12 are connected to the two input terminals of a first comparator 70. The terminals 20 and 22 of the second input 18 are connected to the two input terminals of a second comparator 72. The terminals 26 and 28 of the third input 24 are connected to the two input terminals of a third comparator 74. At their outputs, the comparators provide corresponding differential output signals having well-defined voltage levels.

The outputs of the first comparator 70 are connected to first inputs 76 and 78 of a first multiplexer 80. The outputs of the second comparator 72 are connected to second inputs 84 of the first multiplexer 80. The outputs 86 and 88 of the first multiplexer 80 are connected to a first demodulator circuit 90.

The outputs of the third comparator 74 are connected to first inputs 92 and 94 of the second multiplexer 96. The outputs of the second comparator 72 are also connected to second inputs 98, 100 of the second multiplexer 96. The outputs 102 and 104 of the second multiplexer 96 are connected to a second demodulator circuit 106.

The first multiplexer 80 is arranged to be controlled by a selector signal, which is applied to the terminal 42 of the integrated circuit demodulator component 10. The terminal 42 is connected through a connection 108 with the selector input 110 of the first multiplexer 80. The second multiplexer 96 is controlled by a selector signal, which is applied to the terminal 44 of the integrated circuit demodulator component 10. The terminal 44 is connected through a connection 112 with a selector input 114 of the second multiplexer 96.

A first output 116 of the demodulator circuit 90 is connected to a TTL-driver 118. A second output 120 of the demodulator circuit 90 is connected to a TTL-driver 122. A first output 124 of the second demodulator circuit 106 is connected to a TTL-driver 126. A second output 128 of the demodulator circuit 106 is connected to a TTL-driver 130.

The output of the TTL-driver 118 is connected to the terminal 32. The output of the TTL-driver 122 is connected with the terminal 34. The output of the TTL-driver 126 is connected to the terminal 38. The output of the TTL-driver 130 is connected to the terminal 40. Two mutually inverted, TTL-compatible, "non-return-to-zero" output signal appear at the terminals 32 and 34 of the output 30. Two mutually inverted, TTL-compatible, "non-return-to-zero" output signals appear at the terminals 38 and 40 of the output 36.

FIG. 2 illustrates a signal processing arrangement in which the integrated circuit demodulator component of the type described with reference to FIG. 1 is arranged in such a way, that not only the demodulator but also a modulator can be tested with operational signals during operation.

A unit A is illustrated by a block 140. The unit A contains a plurality of integrated circuit components: Numeral 142 designates a processor. The processor 142 is connected with an output port 146 through a data bus 144. The output port is connected to the selector input 42 of the integrated circuit demodulator component 10, which also forms part of the unit A. For simplicity, only one multiplexer 80 and one demodulator circuit 90 are shown in FIG. 2. Furthermore, the unit A contains an integrated circuit modulator component 148 with a modulator 150. A further integrated circuit component of the unit A is a digital transmitter-receiver component 152. The transmitter-receiver component communicates through a bus interface 154 with the data bus 144 and thus with the processor 142.

The transmitter-receiver component 152 comprises a multiplexer 156. The multiplexer 156 has a first pair of inputs 158 and 160. The input 158 of the multiplexer 156 is connected to a terminal 162 of the transmitter-receiver component 152. The input 160 of the multiplexer 156 is connected to a terminal 164 of the transmitter-receiver component 152. Furthermore, the multiplexer 156 has a second pair of inputs 166 and 168. Two outputs 170 and 172 of the multiplexer are connected with a receiver 174. The receiver communicates through a data bus 176 with the data bus interface 154. Furthermore, the transmitter-receiver component 152 contains a transmitter 178. The transmitter 178 is connected with the data bus interface 154 through a data bus 180. The transmitter 178 has two outputs 182 and 184. The output 182 is connected to a terminal 186 of the transmitter-receiver component 152. The output 184 is connected to a terminal 188 of the transmitter-receiver component 152.

The outputs 32 and 34 of the integrated circuit demodulator component 10 are connected to the inputs 162 and 164, respectively, of the transmitter-receiver component 152. Signals from the system bus 207 of another unit B are applied to the input 12 of the integrated circuit demodulator component.

The modulator 150 has two inputs 190 and 192. The inputs 190 and 192 are connected to terminals 194 and 196, respectively, of the integrated circuit modulator component 148. Furthermore, the modulator 150 has two outputs 198 and 200. The outputs 198 and 200 are connected to the terminals 202 and 204, respectively, of the integrated circuit modulator component. The terminals 202 and 204 are connected to lines of the system bus of unit A.

The transmitter-receiver component 152 has an internal test feedback loop 208. The test feedback loop 208 connects the outputs 182 and 184 of the transmitter within the transmitter-receiver component 152 with the inputs 166 and 168, respectively, of the multiplexer 156. In this way, the transmitter-receiver component can be tested during operation by means of operational signals. For this test, the inputs 166 and 168 instead of the inputs 158 and 160, respectively, are connected to the receiver 174. Then the processor can check, whether the signals received by the receiver 174 and handed over to the processor 142 are identical with the signals transmitted by the transmitter 178. If this is not the case, this is an indicia of a failure of the transmitter-receiver component 152.

A further test feedback loop 210 extends from the terminals 202 and 204 of the integrated circuit modulator component 148 to the input 18 with the terminals 20 and 22 of the integrated circuit demodulator component 10. In this way, the output signals of the modulator 150 are applied to the inputs 98 and 100 of the multiplexer 80. For test purposes, the signal from the output of the modulator 150 is applied to the demodulator circuit 90 by a signal which is supplied by the processor 142 through the output port 146 and terminal 42 to the selector input 110 of the multiplexer 80. The signals received by the receiver 174 through the inputs 158, 160 of the multiplexer 156 and the inputs 170 and 172 must then be identical with the signals provided by the transmitter 178. If it has been found, by a preceding test as described above, that the transmitter-receiver component 152 is operative, then non-identity indicates that either the integrated circuit modulator component 148 or the integrated circuit demodulator component 10 is defective.

With the embodiment of the integrated circuit demodulator component as shown in FIG. 1, it is also possible to determine, whether the modulator component 148 or the demodulator component 10 is defective. To this end, at first, the test feedback loop 210 is connected to the demodulator circuit 90 through the input 18 and the multiplexer 80, with a selector signal at terminal 42 and the selector input 110. If the non-identity of the signals is detected by the processor 142, thus a failure of either the modulator component 148 or the demodulator component 10, then a selector signal is applied to the terminal 44 and the selector input 114 of the second multiplexer 96. Then the second multiplexer 96 connects the test feedback loop 210 to the second demodulator circuit 106. If then identity of transmitted and received signals is detected by the processor, then the demodulator circuit 90 is defective. If, however, also after this change-over by the processor no identity of transmitted and received signals is detected, the failure is in the integrated circuit modulator component 148.

I claim:

1. An integrated circuit demodulator component apparatus comprising plural demodulator circuits, plural multiplexers, plural inputs and outputs, plural selector inputs, characterized in that:

(a) the demodulator circuits comprise a first and a second demodulator circuit;
   (b) the multiplexers comprise a first and a second multiplexer, the first multiplexer being associated with the first demodulator circuit and the second multiplexer being associated with the second demodulator circuit;
   (c) the inputs comprise a first, a second and a third input; the first input being arranged to be connected to the first demodulator circuit through the first multiplexer, and the second input being arranged to be connected to the first demodulator circuit through the first multiplexer, and further the second input being arranged to be optionally connected to the second demodulator circuit through the second multiplexer, and the third input being arranged to be optionally connected to the second demodulator circuit through the second multiplexer;
   (d) the outputs comprise a first and a second output, the first output being connected to the first demodulator circuit, and the second output being connected to the second demodulator circuit, and
   (e) the selector inputs comprise a first and a second selector input, the first selector input being arranged to control the first multiplexer and the second selector input being arranged to control the second multiplexer;

wherein the multiplexers are arranged to optionally connect either the first input or the second input to the respective demodulator circuits, the selector inputs are arranged to receive either of plural selector signals whereby the multiplexers connected to the selector inputs are controlled by the selector signals received by the selector inputs.

2. An integrated circuit demodulator component as claimed in claim 1, and further comprising means for applying, for test purposes, during operation, signals to said second input for processing by said integrated circuit demodulator component.

3. An apparatus according to claim 1 comprising:
   a processor arranged to transmit signals, through a data bus and a transmitter-receiver component, to a modulator component for further transmission to a system bus of a first unit, and to receive signals from the system bus of a second unit through the integrated circuit demodulator component, said transmitter-receiver component and said data bus, wherein an output of said modulator component is connected to said second input of said integrated circuit demodulator component through a test feedback loop.

* * * * *